(12) United States Patent
Miner

(10) Patent No.: US 6,862,704 B1
(45) Date of Patent: *Mar. 1, 2005

(54) APPARATUS AND METHOD FOR TESTING MEMORY IN A MICROPROCESSOR

(75) Inventor: Daniel G. Miner, Austin, TX (US)

(73) Assignee: IP-First, LLC, Fremont, CA (US)

( * ) Notice: Subject to any disclaimer, the term of this patent is extended or adjusted under 35 U.S.C. 154(b) by 263 days.

This patent is subject to a terminal disclaimer.

(21) Appl. No.: 10/236,789

(22) Filed: Sep. 7, 2002

Related U.S. Application Data

(63) Continuation of application No. 09/970,280, filed on Oct. 3, 2001, now Pat. No. 6,493,839, which is a continuation of application No. 09/299,673, filed on Apr. 26, 1999, now Pat. No. 6,370,661.

(51) Int. Cl.[7] .......................... G11C 29/00; H02H 3/05
(52) U.S. Cl. .................................. 714/718; 714/31
(58) Field of Search ................................ 714/718, 763, 714/31, 32, 33, 30, 42, 54; 712/227

(56) References Cited

U.S. PATENT DOCUMENTS

| | | | | |
|---|---|---|---|---|
| 5,819,025 A | * | 10/1998 | Williams | 714/30 |
| 5,961,653 A | * | 10/1999 | Kalter et al. | 714/7 |
| 6,003,142 A | * | 12/1999 | Mori | 714/30 |
| 6,370,661 B1 | * | 4/2002 | Miner | 714/718 |
| 6,493,839 B1 | * | 12/2002 | Miner | 714/718 |

* cited by examiner

Primary Examiner—Christine T. Tu
(74) Attorney, Agent, or Firm—Richard K. Huffman; James W. Huffman

(57) ABSTRACT

An apparatus and method are provided for testing memory circuits in a microprocessor. The apparatus includes test management logic and test execution logic located within the microprocessor. The test management logic has a non-specific test program stored therein, and it accepts test parameters provided by an external test controller. The test parameters are applied to the non-specific test program to produce a specific test program by inserting the test parameters in place of a plurality of non-specific test operands. The test execution logic executes the specific test program to test the memory circuits within the microprocessor at the internal speed of the microprocessor.

19 Claims, 7 Drawing Sheets

Configurable BIST

Testing Multiple Memories in a Microprocessor - Direct Access Technique

Testing Multiple Memories in a Microprocessor - BIST Technique

APPARATUS AND METHOD FOR TESTING MEMORY IN A MICROPROCESSOR

CROSS-REFERENCE TO RELATED APPLICATIONS

This application is a continuation of U.S. patent application Ser. No. 09/970,280 entitled, APPARATUS AND METHOD FOR TESTING MEMORY IN A MICROPROCESSOR, having common assignee and inventors, and filed on Oct. 3, 2001 now U.S. Pat. No. 6,493,839, which is a continuation of Ser. No. 09/299,673 now U.S. Pat. No. 6,370,661, entitled APPARATUS AND METHOD FOR TESTING MEMORY IN A MICROPROCESSOR, having common assignee and inventors, and filed on Apr. 26, 1999.

BACKGROUND OF THE INVENTION

1. Field of the Invention

This invention relates in general to microprocessor design and manufacture, and more particularly to an apparatus and method for testing memory circuits in a microprocessor.

2. Description of the Related Art

Two techniques are primarily employed to test memories in a microprocessor: the direct access technique and the built in self test (BIST) technique.

The direct access technique utilizes additional logic devices within the microprocessor to route all essential signals required for testing internal memories out to exterior pins on the operational package of the microprocessor. Thus, when the microprocessor is installed in a chip tester, the additional logic routes the address/data/control signals for a designated memory directly to external pins, thus bypassing internal circuitry that would otherwise preclude access to the signals. As a result, the chip tester is able to configure and execute any desired test sequence to detect defects in the designated memory. But, the additional logic devices, in order to route the signals to the external pins, are unavoidably designed directly into the primary internal path of the signals, thus introducing delays into both test mode operation and normal mode operation of the microprocessor. More precisely, the delays caused by additional direct access routing logic in the microprocessor prevent testing of its memories at full speed. But, more importantly, the delays slow down its normal operation. Consequently, while direct access testing provides the capability to configure virtually any test sequence, the inherent delays imposed by the additional logic slows down the normal operation of the device and allows a notable number of defects to go undetected, because the memories cannot be tested at full speed. Another negative side effect of the direct access method is that a large amount of (very expensive) chip tester vector memory is required to store the different data patterns that are required to write to and read from the memory array. An advantage of this method is that the chip tester is able to determine exactly which bits are bad or good. This is useful for memory array repair when the array is designed with redundant rows and/or columns.

The BIST technique directly interfaces dedicated test circuits, all within the microprocessor, to the essential memory signals so that each memory can be tested at full speed. More specifically, logic internal to the microprocessor is employed to test its memories. Address sequences and data patterns are programmed into BIST logic so that additional logic is not required to route the essential signals to a chip tester. But, while BIST logic provides for testing memories in a microprocessor at full speed, once it is designed into the microprocessor, its address sequences and data patterns are cast into stone, so to speak. Conventional BIST logic cannot be modified. To change a test sequence requires a design modification be made to the microprocessor. In contrast to the direct access method, BIST consumes very little chip tester vector memory, yet BIST only provides a rudimentary capability for a chip tester to determine exactly which bits of the memory array are good or bad. This BBIST logic also consumes silicon area and power that is essentially wasted in normal use since it is only useful during chip manufacturing testing.

So, a microprocessor designer is forced to choose: should memory test configurability and ease of memory array repair be provided at the expense of full speed testing and a large amount of chip tester vector memory? Or, should full speed testing and small amount of chip tester vector memory be provided at the expense of memory test configurability and ease of memory array repair? One skilled in the art will appreciate that all capabilities are required.

Therefore, what is needed is an apparatus in a microprocessor for testing memory that can test the memory at full speed, provide the capability to configure test parameters, provide the necessary data to allow memory array repair, and consume a small amount of chip tester vector memory. The apparatus must not inhibit full speed operation of the microprocessor when it is not testing memory.

In addition, what is needed is a configurable memory test apparatus within a microprocessor that can accept test parameters from a chip tester for the conduct of full speed tests on memories within the microprocessor.

Furthermore, what is needed is a microprocessor that can apply test parameters provided from a chip tester to a generic built in test sequence to form a specific test sequence for testing memory.

Moreover, what is needed is a method for testing memory in a microprocessor at full speed that can be configured to produce specific test sequences.

SUMMARY OF THE INVENTION

To address the above-detailed deficiencies, it is an object of the present invention to provide an apparatus for full speed testing of memory in a microprocessor that has the capability to configure test parameters, that provides the necessary information to properly repair the memory array, and consumes a relatively small amount of chip tester vector memory.

Accordingly, in the attainment of the aforementioned object, it is a feature of the present invention to provide an apparatus in a microprocessor for testing memory within the microprocessor. The apparatus includes test management logic and test execution logic. The test management accepts test parameters from a source external to the microprocessor and produces a specific test program where the specific test program is produced from a non-specific test program by insertion of the test parameters in place of a plurality of non-specific test operands. The test execution logic is coupled to the test management logic and executes the specific test program.

An advantage of the present invention is that full speed testing can be performed on memories in a microprocessor without having to sacrifice the ability to configure test sequences that were not originally designed into the device.

An additional advantage of the present invention is that information is collected during memory testing to facilitate memory array repair.

Another object of the present invention is to provide a configurable memory test apparatus within a microprocessor that can accept test parameters from a chip tester.

In another aspect, it is a feature of the present invention to provide an apparatus for testing memory in a microprocessor. The apparatus has a test controller, test management logic, and test execution logic. The test controller provides test parameters to the microprocessor to configure a specific test program. The test management logic is within the microprocessor and is coupled to the test controller. The test management logic accepts the test parameters and generates the specific test program, where the specific test program is generated from a non-specific test program by insertion of the test parameters in place of a plurality of non-specific test operands. The test execution logic is within the microprocessor and is coupled to the test management logic. The test execution logic executes the specific test program.

Another advantage of the present invention is that chip tester programs, because they only pass test parameters to a microprocessor, are less complex and utilize less of the tester's resources. Only a small amount of memory within a chip tester is required.

A further object of the invention is to provide a microprocessor that can apply test parameters provided from a chip tester to a generic built in test sequence to form a specific test sequence for testing memory.

In a further aspect, it is a feature of the present invention to provide an apparatus for testing a microprocessor. The apparatus includes a test controller, a test configuration register, and a first sequence of micro instructions stored in a control ROM. The test controller provides test parameters to the microprocessor that prescribe a specific test to be performed. The test configuration register is located in the microprocessor and is coupled to the test controller. The test configuration register receives the test parameters. The first sequence of micro instructions stored in a control ROM is coupled to the test configuration register. The first sequence of micro instructions stored in a control ROM applies the test parameters to generate a second sequence of micro instructions that direct the microprocessor to execute the specific test, where the first sequence of micro instructions employs non-specific operands within, and wherein the test parameters are applied as operands in place of the non-specific operands to generate the second sequence of micro instructions.

A further advantage of the present invention is that test circuits in a microprocessor can be configured to test for heretofore unknown defects.

Yet another object of the present invention is to provide a method for testing memory in a microprocessor at full speed that can be configured to produce specific test sequences.

In yet another aspect, it is a feature of the present invention to provide a method for testing memory in a microprocessor at full speed. The method includes providing parametric data to the microprocessor that prescribes a specific memory test, applying the parametric data to a sequence of micro instructions within the microprocessor to form a specific sequence of micro instructions that direct the microprocessor to perform the specific memory test, and executing the specific sequence of micro instructions by the microprocessor. The applying includes inserting specific operands in the sequence of micro instructions in place of non-specific operands to form the specific sequence of micro instructions. Execution of the specific sequence is performed at full speed.

Yet another advantage of the present invention is that present invention provides for testing of more potential failure modes than has heretofore been provided, without requiring design modifications to a microprocessor.

BRIEF DESCRIPTION OF THE DRAWINGS

These and other objects, features, and advantages of the present invention will become better understood with regard to the following description, and accompanying drawings where.

DETAILED DESCRIPTION

Several related art examples with respect to memory testing will now be described with reference to FIGS. 1 through 4. These examples illustrate the problematic nature of present day memory testing techniques, particularly when it is desired to test memories at full speed within a microprocessor, yet when configurability of test parameters is also required. Following this discussion, a detailed description of the present invention will be provided with reference to FIGS. 5 through 7. Use of the present invention provides both the flexibility to configure specific parameters for testing memories in a microprocessor and allows for memory array repair without consuming excessive tester resources. The present invention moreover provides the ability to test those memories at full speed without compromising full speed operation of the microprocessor when it is in a normal mode of operation.

Figure 1:
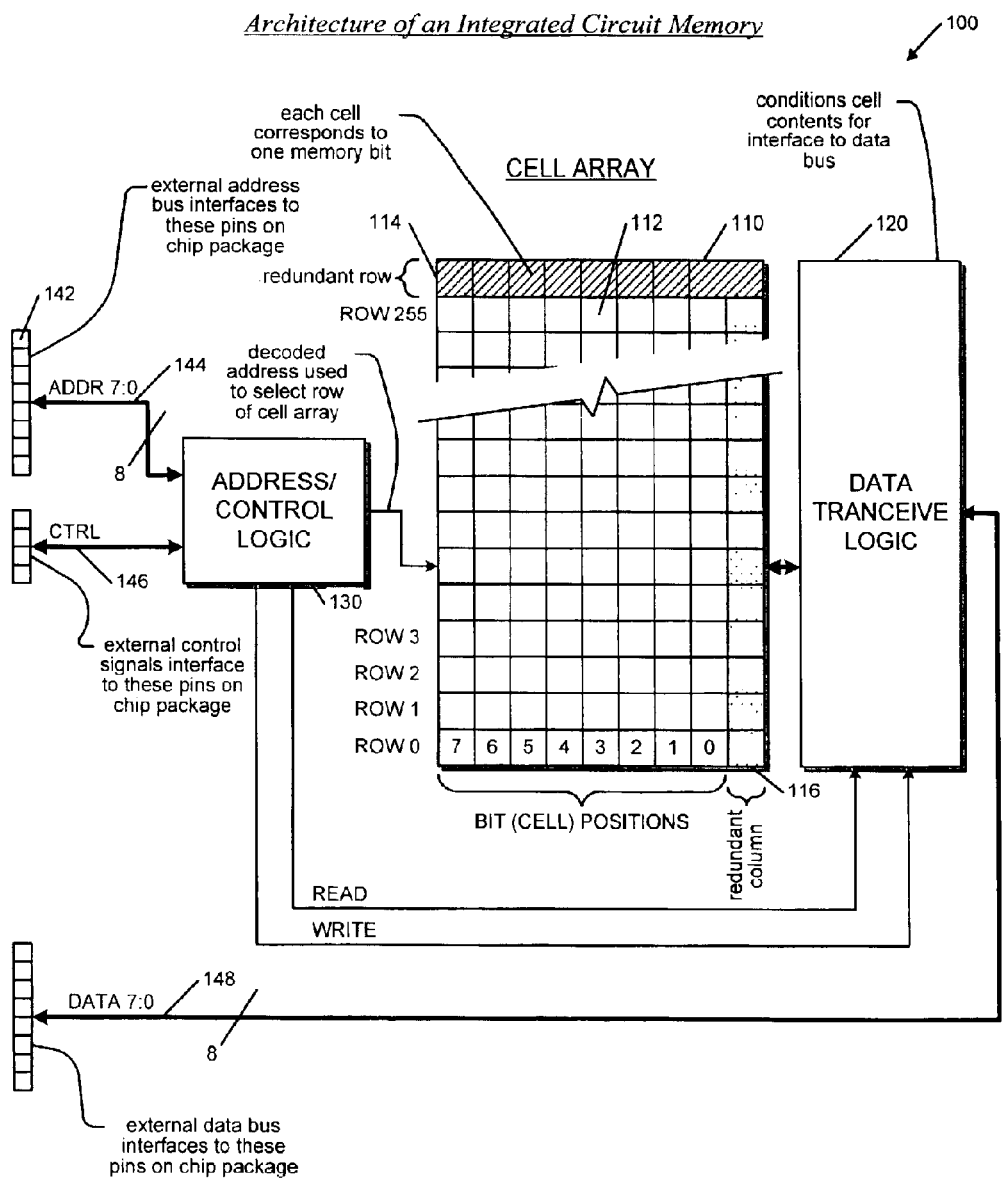
FIG. 1 is a block diagram illustrating the architecture of a related art memory circuit.

Now referring to FIG. 1, a diagram is presented illustrating the architecture of a related art memory circuit 100. The memory circuit 100 includes a cell array 110 that is indexed by address/control logic 130. The memory circuit 100 also has data transceive logic 120 that conditions contents of the cell array 110 for interface to logic (not shown) external to the memory circuit. Signals to/from the address/control logic 130 and the data transceive logic 120 are coupled to connection pins 142 on the operational package of the memory circuit. The memory circuit also has a redundant row 114 of cells 112 and a redundant column 116 of cells 112 to allow the array 110 to be repaired in the event there are a small number of defects in the array 110.

In operation, the memory circuit 100 is connected to external logic devices via an external address bus (not shown), an external control bus (not shown), and an external data bus (not shown). The external address bus is connected to pins 142 on the operational package of the memory circuit 100 that interface to an internal address bus 144. Likewise, the external data bus is connected to pins 142 on the operational package of the memory circuit 100 that interface to an internal data bus 148. Similarly, the external control bus is connected to pins 142 on the operational package of the memory circuit 100 that interface to an internal control bus 146. The address/control logic 130, data transceive logic 120, and the cell array 110 are typically fabricated on a single integrated circuit, or chip. Following fabrication, the chip is seated within the operational package and short bond wires are attached between connection pads (not shown) on the chip and the connection pins 142 on the operational package. In this form, the memory circuit 100 is then soldered to a printed wiring board (not shown) as part of a more complex circuit (not shown).

A particular row of cells 112 is indexed by the address/control logic 130. Contents of the particular row are provided to or from the data transceive logic 120 according to states of signals on the control bus 146. Thus, any one of the 256 rows in the cell array 110 can be accessed, i.e., written or read, by providing proper signal states to the pins 142 on the operational package.

Memories are fabricated with different size cell arrays for different applications. FIG. 1 shows a separate address bus 144 and data bus 148, each bus 144, 148 being eight bits in size. Yet, a different memory device may have a multiplexed address/data bus that utilizes control bus signals to distinguish between addresses and data present on the bus.

When a fabricated part is assembled into its operational package, it is tested prior to shipment. In general, tests are designed to cause a device to execute all of its specified functions, thus assuring that the device operates satisfactorily. A test for a memory circuit 100 consists of a sequence of reads and writes to all of the rows within its cell array 110. By accessing all of the rows in the cell array 110, it is ensured that the address/control logic 130 is capable of decoding any combination of signals on the internal address buss 144 and that each row of the cell array 110 can be accessed. Writing data to a row in the cell array 110 and then reading back the contents of the row ensures that the data transceive logic 120 works properly and that the particular row can be written with data and subsequently read.

Testing a memory circuit 100 appears to be simple, yet it is not quite so straightforward. Because the contents of each cell 112 within the cell array 100 cannot actually be observed during testing, it is not apparent that the data resulting from a read of a given row in the cell array 110 is in fact the actual contents of the cells 112 in the given row. Suppose that a test sequence causes logical ones to be written to every cell 112 in the cell array 110 beginning with row 0 and ending with row 255. Next, suppose that the test sequence causes the contents of row 1 to be read. Even if the retrieved data pattern is all logical ones, one cannot unequivocally assert that the address/control logic 130 really accessed row 1 for the read operation. In fact, it is conceivable that the address/control logic 130 could be defective in its least significant address bit, so that row 0 was actually accessed for both the write and the read. But because logical ones were retrieved from a supposed access to row 1, a tester may infer that row 1 was written and read according to specification, when in fact row 1 was never written nor read. Thus, to conduct a test on a memory circuit 100 with high confidence in the result requires that data be written to the memory 100 and read from the memory 100 in such address sequences and data patterns as to isolate the functionality of one cell 112 from the next cell 112. By doing so, unambiguous test results are obtained.

Test steps to produce the desired data patterns and address sequences can be determined, that is, when one assumes that each of the cells 112 within a given memory circuit 100 function consistently, even in the presence of a failure mode. But, memory cells 112, because they are inherently charge storage devices, do not function consistently in the presence of defects—they leak charge. For example, a logical one written to a given cell 112 at time $t_0$, in the presence of a defect, may still be a logical one at a later time $t_1$, but it will decay to a logical zero at a subsequent time $t_2$. Likewise in the presence of a defect, a slow write to a given address in the cell array 110 may result in data being properly written, but a fast write to the given address would result in the data being improperly written.

Two principles regarding memory testing can be ascertained from the preceding discussion. First, the configuration of a specific sequence of reads and writes to test a given memory circuit 100 must be flexible. For instance, to isolate a given defect, the results of one sequence of test steps may require that a supplemental sequence of reads and writes be performed having data patterns and addresses that could not have been predicted at the beginning of the test. Second, it is important to test a memory circuit 100 at full speed. To test a memory circuit 100 at less than full operating speed would allow a remarkable number of probable failure modes to go undetected.

Figure 2:
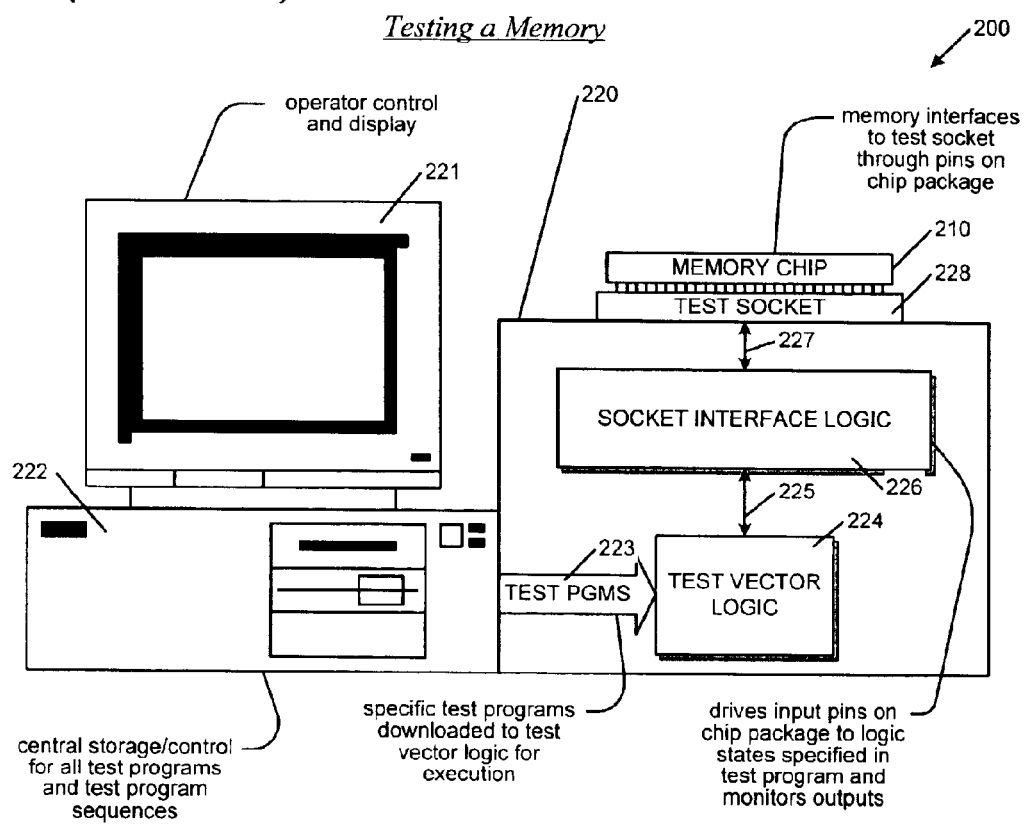
FIG. 2 is a diagram illustrating how a memory circuit is tested after it has been assembled into its operational package.

Now referring to FIG. 2, a diagram 200 is presented illustrating how a memory circuit is tested. The diagram 200 shows a memory chip 210 installed into a chip tester 220, or test controller 220. The chip tester 220 has a test socket 228 to which the connection pins on the memory chip 210 are connected. Each connection is routed via bus 227 to socket interface logic 226. The socket interface logic 226 interfaces to test vector logic 224 via bus 225. Stored test sequences, or test programs are downloaded to the test vector logic 224 via bus 223 from a host computer 222. The host computer 222 is used to configure and store test programs and sequences for the memory chip 210. An operator (not shown) configures the test programs via an operator interface device 221, typically a monitor and keyboard.

Operationally, during the design of a memory chip 210, characteristics and idiosyncrasies of the chip 210 are noted so that a set of data patterns and address access sequences are designed to test the assembled memory circuit 210 in the chip tester 220. The set is incorporated into a series of automated test programs which are stored in the host computer 222. To provide flexibility, some of the automated test programs allow the operator to insert test parameters such as address range, data patterns, the number of times to write an address before it is read, and the like.

The operator installs a memory chip 210 into the test socket 228 and retrieves a particular test program from a storage device (not shown) in the host computer 222. Via the operator interface device 221, the operator enters test parameters for conduct of the test. Once configured, a test program having the entered test parameters is downloaded by the host computer 222 via bus 223 to the test vector logic 224.

The test vector logic 224 provides the interface between the host computer 222 and the socket interface logic 226. As such, the test vector logic 224 provides temporary storage for the configured test program. The test vector logic 224 also executes the configured test program to cause specified pins on the memory chip 210 to be set to prescribed states at prescribed times during the test. Hence, the test vector logic 224 executes the configured test program to drive the pins on the memory chip 210. The socket interface logic 226 translates generic test vector signals provided over bus 225 so that they are compatible with the formats and levels required by the device under test, in this case, a memory chip 210. The translated signals are routed to the test socket 228 via bus 227. The test socket 228 provides a direct physical interface for each translated signal to a corresponding pin on the operational package of the memory chip 210.

The memory chip 210 is tested at full speed. Additionally, if a given test program yields questionable results, then the operator can perform the test again, or he can modify certain test parameters so that a failure mode can be further analyzed and its corresponding defect identified. In the extreme, if an unforeseen failure mode surfaces in the course of testing, the chip tester 220 provides the flexibility to generate an entirely new test program for the express purpose of testing for the unforeseen failure mode. Although such extreme measures are normally taken prior to full rate production of a part, the capability exists for test programs to be implemented to generate any combination of signal states to access all of the addresses within the memory 210, in any order, with any data pattern.

Although the preceding discussion references testing of stand-alone memories, it is now common practice to incorporate memory circuits into a more complex integrated circuit design. And, because the memories are directly connected to other logic devices in the integrated circuit, their operational speed is not limited by the electrical characteristics of a conventional device package. As a result, memories within a higher level integrated circuit operate many times faster than a stand-alone memory circuit.

In a present day microprocessor, there are many memory-circuits, each one having address, data, and control signals. For example, a present day microprocessor typically has a data cache memory, an instruction cache memory, and a register file-all memory devices. But, because the signals necessary to test the memories are not typically connected to external pins on the microprocessor, designers have been forced to provide alternative memory testing techniques. Techniques for testing memories in a microprocessor fall into two classes: direct access techniques and built in self test (BIST) techniques. These two techniques are more specifically described with reference to FIGS. 3 and 4.

Figure 3:
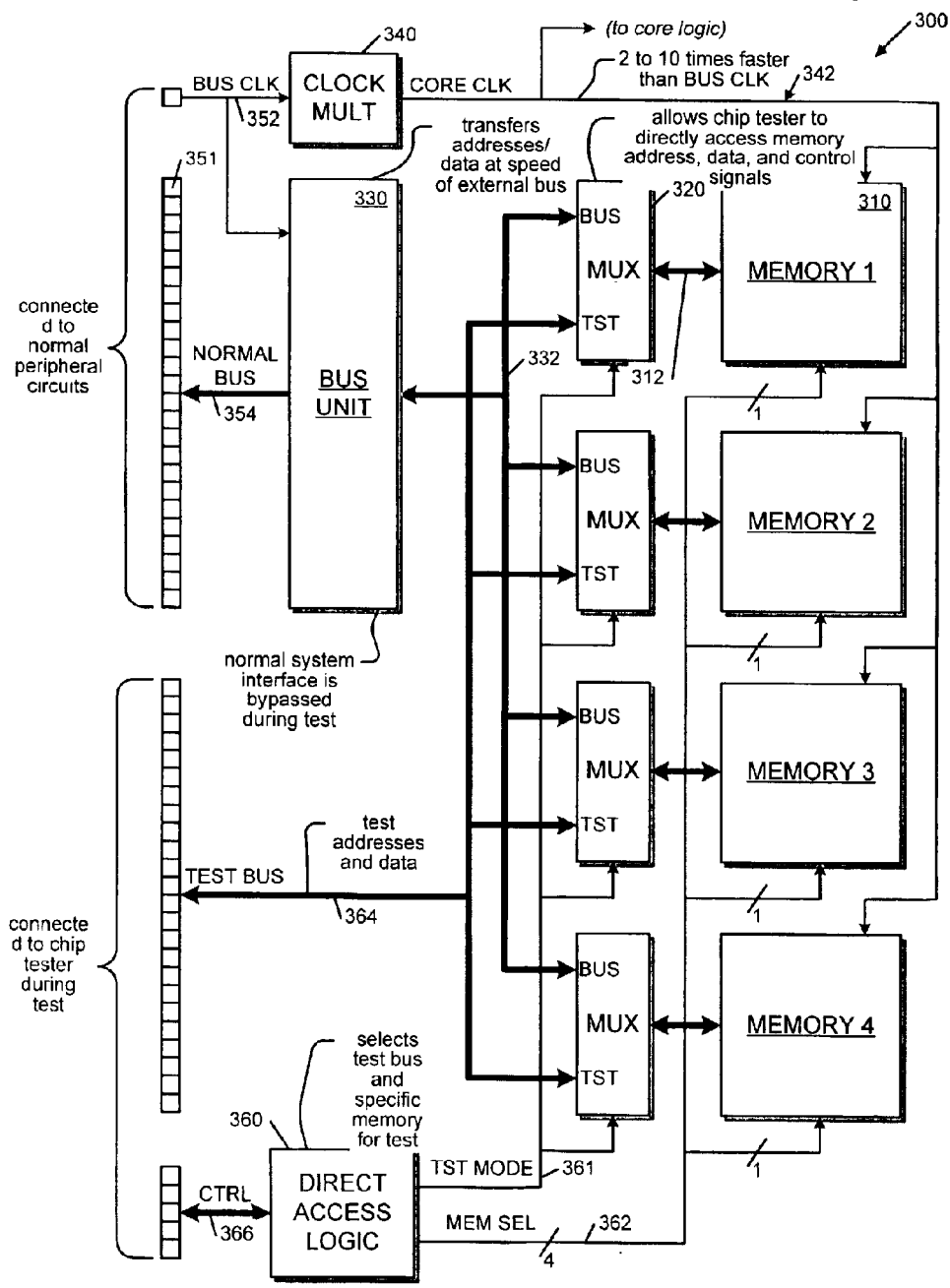
FIG. 3 is a block diagram of a related art microprocessor having multiple memory circuits that are tested by a direct access technique.

Referring to FIG. 3, a block diagram is presented of a related art microprocessor 300 having multiple memory circuits 310 that are tested by a direct access technique. For the purposes of illustration, four like memories 310 are depicted: memory 1 310, memory 2 310, memory 3 310, and memory 4 310. Each memory 310 has a corresponding memory bus 312 for interface of address, data, and control signals. The microprocessor 300 also has a bus unit 330 that controls a normal bus 354, the normal bus 354 being connected to pins 351 on the operational package of the microprocessor 300. The microprocessor 300 has direct access logic 360 connected to pins 351 on the operational package of the microprocessor 300 via a test control bus 366. The direct access logic 360 provides outputs to each memory 310 and a corresponding mux 320. A given mux 320 routes its corresponding memory bus 312 either to a local bus 332 during normal operation of the microprocessor 300 or to a test bus 364. The test bus 364 is connected to pins 351 on the operational package of the microprocessor 300 and is used to directly interface a chip tester to a specific memory 310 during test. The specific pins 351 to which the test bus 364 connects are typically connected to external peripheral circuits when the microprocessor 300 is in a normal operating mode. The microprocessor 300 also has a clock multiplier 340 that receives a bus clock signal 352 from a pin 351 and provides a core clock output signal 342 to drive core logic devices in the microprocessor at a speed much faster than external logic devices. The core clock 342 is connected to the memories 310.

When the microprocessor 300 is in a normal operating mode, the memory busses 312 are connected through the mux devices 320 to the local bus 342 of the microprocessor 300. The local bus 342 and other logic devices (not shown) connected to the local bus 342 typically run at the speed of the core clock signal 342. If an external logic device (not shown) requires access to a memory 310, the access is controlled by the bus unit 330. The bus unit 330 operates at the speed of the bus clock signal 352. Thus, the corresponding access to the memory 310, as seen from the normal bus 354, is also performed at the speed of the bus clock signal 352, many times less than the full operating speed of the memories 310. In actuality, all accesses to the memories 310 are performed at full speed within the microprocessor 300, but because the bus unit 330 operates at the speed of the bus clock signal 352, back-to-back full speed accesses to memory are precluded from the normal bus 354. In addition, because memories 310 in a microprocessor 300 are dedicated to performing different functions, the bus unit 330 precludes external logic devices from arbitrarily accessing a memory 310 or any given cell in a memory 310.

Because the bus unit 330 prevents testing memories 310 in a microprocessor 300 from an external bus, direct access logic 360, mux devices 320, a test bus 364, and related test control signals 361, 362, 366 are added to a microprocessor design to directly route memory address, data, and control signals to pins 351 on the operational package of the microprocessor 300 when it is tested.

To test the memories 310, the microprocessor 300 is inserted into a test socket of a chip tester. The chip tester initializes the microprocessor into a test mode. The direct access logic 360 asserts the test mode signal 361 to cause the mux devices 320 to route their corresponding memory bus 312 to the test bus 364. Control data sent from the chip tester to the direct access logic 360 selects a particular memory 310 to be tested via a memory select bus 362. The particular memory's memory bus 312 is thus routed directly to the test bus 364.

The direct access technique provides flexibility and the ability to repair a defective array, but it comes at the cost of speed, both during test and operationally. Note that the mux devices 320 are present in the design only for the purposes of routing the memory buses 312 to the test bus 366 rather than the local bus 332. As a result, accesses to the memories 310 are delayed during both normal mode operation and test mode operation. Such delay during normal operation negatively impacts the overall performance of the microprocessor. Additionally, because of the mux delays and delays associated with accessing memories through a conventional operational package, the chip tester can not test the memories 310 at full speed, thus precluding the detection of speed-related failure modes. Moreover, since the chip tester is responsible for controlling the signals associated with the memories to read and write data, extensive test vector resources within the chip tester are required to develop and execute test programs.

Figure 4:
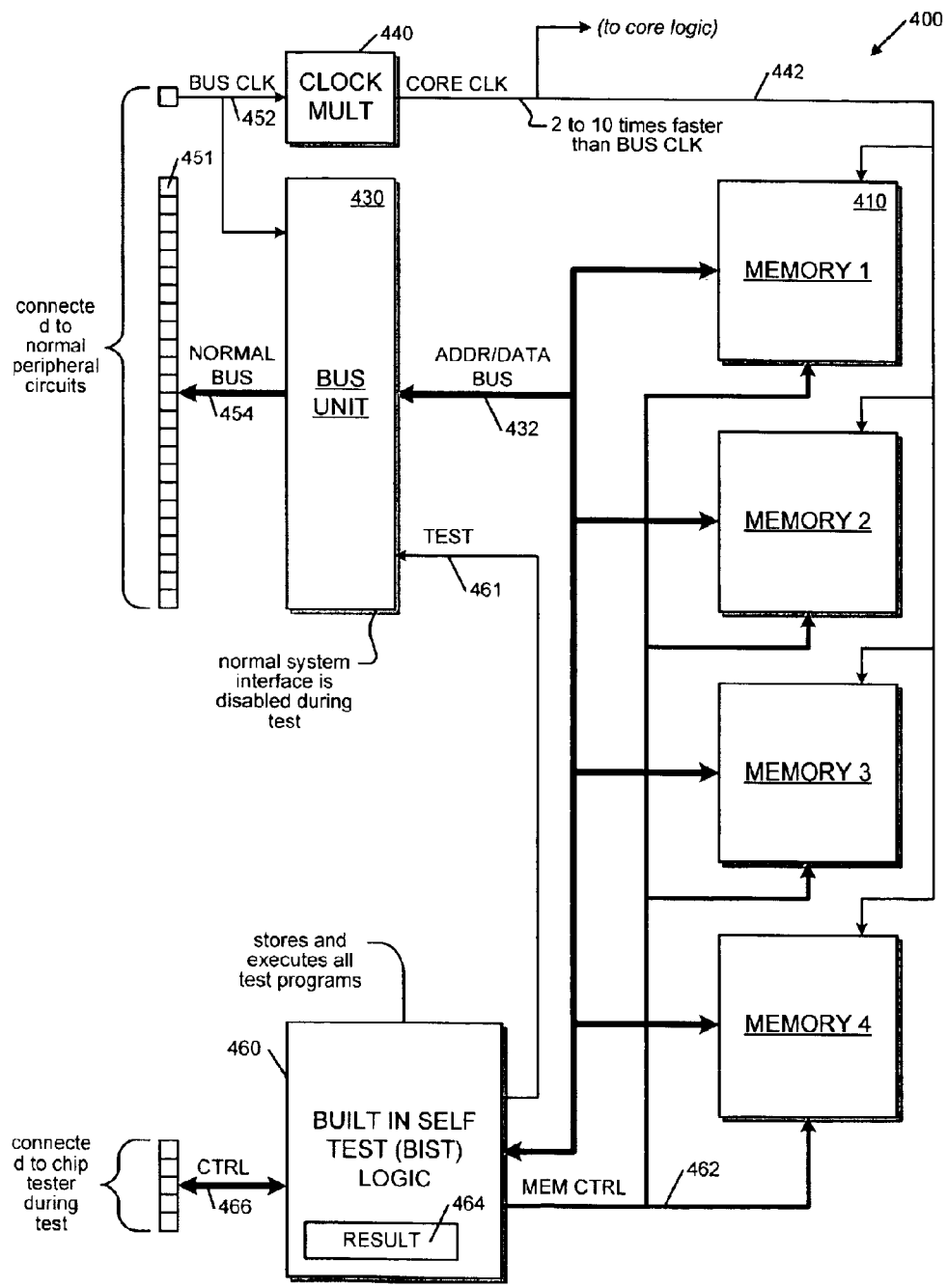
FIG. 4 is a block diagram of a related art microprocessor having multiple memory circuits that are tested by a built in self-test (BIST) technique.

Now referring to FIG. 4, a block diagram is presented of a related art microprocessor 400 having multiple memory circuits 410 that are tested by a built in self-test (BIST) technique. Four like memories 410 are depicted: memory 1 410, memory 2 410, memory 3 410, and memory 4 410. Corresponding address, data, and control signals for each memory 410 are bused together as part of a local bus 432. The microprocessor 400 also has a bus unit 430 that controls a normal bus 454, the normal bus 454 being connected to pins 451 on the operational package of the microprocessor 400. The microprocessor 400 additionally has built in self test (BIST) logic 460 connected to pins 451 on the operational package of the microprocessor 400 via a test control bus 466. The BIST logic 460 directly interfaces to the memories. 410 and to the bus controller 430, thereby eliminating the delay associated with the direct access technique. The microprocessor 400 also has a clock multiplier 440 that receives a bus clock signal 452 from a pin 451 and provides a core clock output signal 442 to drive core logic devices in the microprocessor at a speed much faster than external logic devices. The core clock 442 is connected to the memories 410.

In a normal operating mode, the microprocessor 400 operates just like the microprocessor 300 of FIG. 3, with one difference: Since no mux devices are used to implement the BIST technique, the microprocessor 400 accesses the memories 410 at full speed. In a test mode, the BIST logic 460 directly drives address, data, and control signals on the local bus 432 to access each of the memories 410. The address, data, and control sequences for testing each of the memories 410 are entirely resident within the BIST logic 460.

To test the memories 410, the microprocessor 400 is inserted into chip tester and placed into a test mode via the test control bus 466. In the test mode, the BIST logic 460 sends a test mode control signal 461 to disable the bus unit 430 during conduct of the test. The BIST logic 460 tests each of the memories 410 by performing a predetermined sequence of reads and writes over the local bus 432. A memory control bus 462 selects each memory 410 for test. Test results are written to a result register 464.

Standards exist in the industry for designing BIST logic 460, such as ANSI/IEEE Standard 1149.1, entitled IEEE Standard Test Access Port and Boundary Scan Architecture." Register 464 is commonly referred to as a JTAG registers where JTAG stands for the Joint Test Action Group, a group of experts who contributed to the noted standard.

The BIST technique allows memories 410 in a microprocessor 400 to be tested at full speed, thus providing coverage for speed-related failure modes. But, there are drawbacks to using BIST for testing memories: all of the test sequences are fixed within the BIST control logic 460 and defect location information is limited, thus precluding comprehensive array repair. That is, test sequences are either implemented by sequential logic circuits or by micro instructions stored in a control ROM. Thus, they cannot be modified. After a design is fixed and the test sequences are incorporated into the BIST logic 460, to modify a test sequence to test for, say, an unforeseen failure mode, would require a design modification to the microprocessor 400. In addition, because BIST circuits are added to an existing microprocessor design, the complexity of the microprocessor design is increased as a result. Consequently, the microprocessor requires more power and the probability of defects associated with the chip is increased.

As has been discussed with reference to FIGS. 3 and 4, both the direct access technique and the BIST technique provide positive benefits to memory testing. The direct access technique is flexible: it allows an operator to configure test parameters for a test sequence dynamically and provides comprehensive information that supports repair of the array, both very necessary test features. The BIST technique allows a memory in a microprocessor to be tested at full speed while requiring only a small amount of tester resources, another necessary feature of testing. But, neither of the two techniques provide all desirable features: flexibility, full speed testing, low consumption of chip tester resources, and the ability to provide defect location information to allow array repair. Hence, a designer is forced to choose between these when designing memory test logic in a microprocessor. One skilled in the art will appreciate that for across-the-board coverage of failure modes, it is desirable to have all of these testing capabilities.

The present invention provides all desired features for testing memories in a microprocessor: 1) the flexibility to dynamically configure test parameters during a test; 2) the capability to test the memories at full speed; 3) the capability to gather defect location information so that the array can be repaired, and; 4) it employs only a small amount of chip tester resources. These four benefits are realized in a microprocessor having a configurable BIST architecture that dynamically interacts with a test controller. The present invention is more specifically described with reference to FIG. 5.

Figure 5:
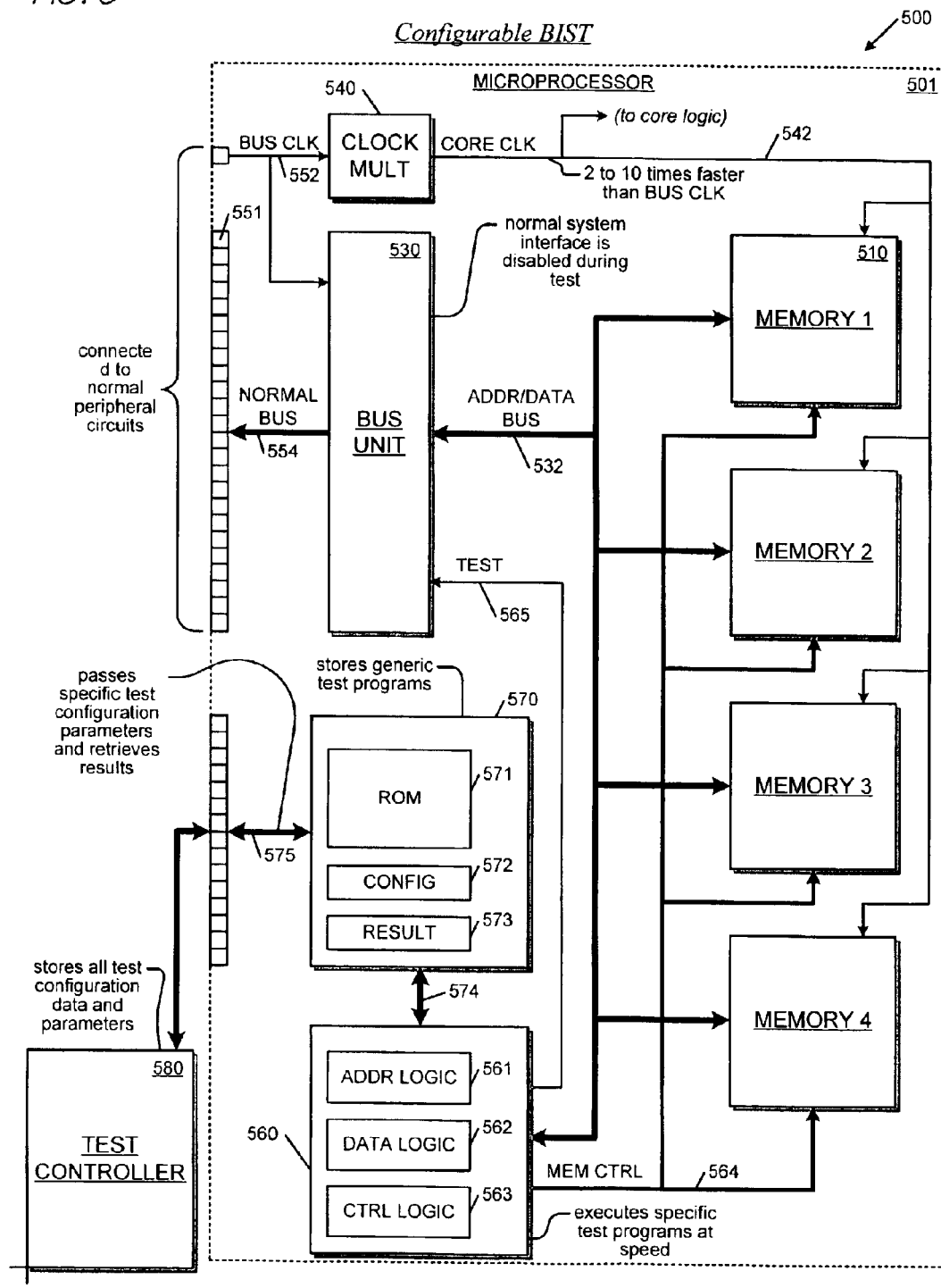
FIG. 5 is a block diagram of an apparatus according to the present invention for testing memory circuits in a microprocessor.

Referring to FIG. 5, a block diagram is presented of an apparatus 500 according to the present invention for testing memory circuits 510 in a microprocessor 501. As with the microprocessors 300, 400 of FIGS. 3 and 4, four like memories 510 are depicted: memory 1 510, memory 2 510, memory 3 510, and memory 4 510. Corresponding address, data, and control signals for each memory 510 are bused together as part of a local address/data bus 532. The microprocessor 501 also has a bus unit 530 that controls a normal bus 554, the normal bus 554 being connected to pins 451 on the operational package of the microprocessor 501. The microprocessor 501 also has test management logic 570 that is connected to pins 551 on the operational package of the microprocessor 501 via a test control bus 575. The test management logic 570 communicates with a test controller 580 over the test control bus 575. The test management logic 570 also interfaces to test execution logic 560 in the microprocessor 501 via bus 574. The test execution logic 560 directly interfaces to the memories 510 and to the bus controller 530, thereby allowing the memories 510 to be tested at full speed. The microprocessor 501 also has a clock multiplier 540 that receives a bus clock signal 552 from a pin 551 and provides a core clock output signal 542 to drive core logic devices in the microprocessor at a speed much faster than external logic devices. The core clock 542 is connected to the memories 510.

In a normal operating mode, the microprocessor 501 operates like the microprocessor 400 of FIG. 4. The memories 510 are accessed by computational logic (not shown) at full speed because there are no other logic devices between the local bus 532 and the memories 510 to cause delay.

In a test mode, similar to the microprocessor 400 of FIG. 4, the microprocessor 501 according to the present invention has test execution logic 560 to directly drive address, data, and control signals on the local bus 532 to directly access each of the memories 510. More specifically, address logic 561 in the test execution logic 560 generates addresses for specified locations in a memory 510 and provides these addresses directly to the local bus 532. Likewise, data logic 562 directly transmits and receives specified data entities to and from the local bus 532. And, control logic 563 directly generates control signals over a memory control bus 564 to select and control a specified memory 510. In one embodiment, the address logic 561, data logic 562, and control logic 563 comprise logic elements that exist in the microprocessor 501 for the purposes of normal operation. They 561, 562, 563 become dedicated to executing test sequences when the microprocessor 501 is placed in a test mode.

And, similar to the microprocessor 400 of FIG. 4, test management logic 570 in the microprocessor 501 comprises test sequences—with two significant distinctions: First, the test sequences within the test management logic 570 are configurable, whereas the test sequences within the BIST logic 460 of FIG. 4 are not configurable. More specifically, the test sequences that are designed into the test management logic 570 are non-specific, that is, they can be configured with test parameters, provided by the test controller 580, to execute accesses to any memory 510, within any address range, to read or write any data pattern. In addition, a test sequence can be configured to repeat a specified number of times before it completes. Second, the intermediate test results of each and every bit cell are output to the pins of the microprocessor 500 which allows the chip tester 580 to generate a defect map and determine the correct way to repair the array.

The test management logic 570 accepts test parameters in a configuration register 572 that are transferred from the test controller 580 over the test control bus 575. Results of a test sequence can be accessed by the test controller 580 in a result register 573. In one embodiment, the configuration register 572 and the result register 573 are JTAG registers in accordance with ANSI/IEEE Standard 1149.1, as described above. In another embodiment, rather than providing test results in the result register 573, the intermediate test results of each and every bit cell-are output to the pins 551 of the microprocessor 500.

In one embodiment, the non-specific test sequences comprise sequences of non-specific micro instructions that are stored in a control ROM 571. As test parameters are passed from the test controller 580, the test management logic inserts operands prescribed by the test parameters into the non-specific sequence of micro instructions to form a specific sequence of micro instructions for performing a specific test. The specific sequence of micro instructions are transferred to the test execution logic 560 via bus 574 for execution. In one embodiment, the test parameters consist of variables to prescribe a designated memory 510 for testing, start address, address increment amount, data pattern to write, expected data pattern on a read, access mode, and number of repetitions. The access mode prescribes whether the prescribed data pattern is to be written, read, or read followed by a write.

In one embodiment, prior to executing a test sequence, the test execution logic 560 sends a test signal 565 to the bus unit 530 to preclude contention on the local bus 532, thus effectively disabling the bus unit during testing 530. As the specific sequence of micro instructions is executed to perform a specific test, the test execution logic 560 compares actual data obtained on a read with the expected data pattern on a bit-by-bit basis. A result of each read, containing a bit-by-bit result, is provided to the test management logic 570 via bus 574. The result is placed in the result register 573 for retrieval by the test controller 580.

It is important to note that it is the logic 560, 570 within the microprocessor 500 that performs the memory tests; the test controller 580 provides test configuration parameters and monitors each result. Because a bit-by-bit indication of a test result is provided rather than actual read data, test vector logic in the test controller can be simplified. In one embodiment, specific micro instructions executed by the test execution logic 560 logically exclusive-OR data read from an address with the expected result provided as a test parameter. If the memory cells contain the correct data pattern, then the result of the exclusive-OR will be all logical zeros. Any defective cell will be represented by a logical one in the result. This dramatically reduces the amount of memory required in the tester (i.e., to store the bit test patterns), which is provides a significant cost savings.

Testing of memories 510 in a microprocessor 501 according to the present invention can be performed at full speed because the test execution logic 560 is connected directly to the local bus 532. In addition, an operator is allowed full flexibility through the test controller 580 to configure any specific sequence of memory accesses to a memory 510. Details regarding how test parameters are configured to generate a specific test is more specifically described with reference to FIG. 6.

Figure 6:
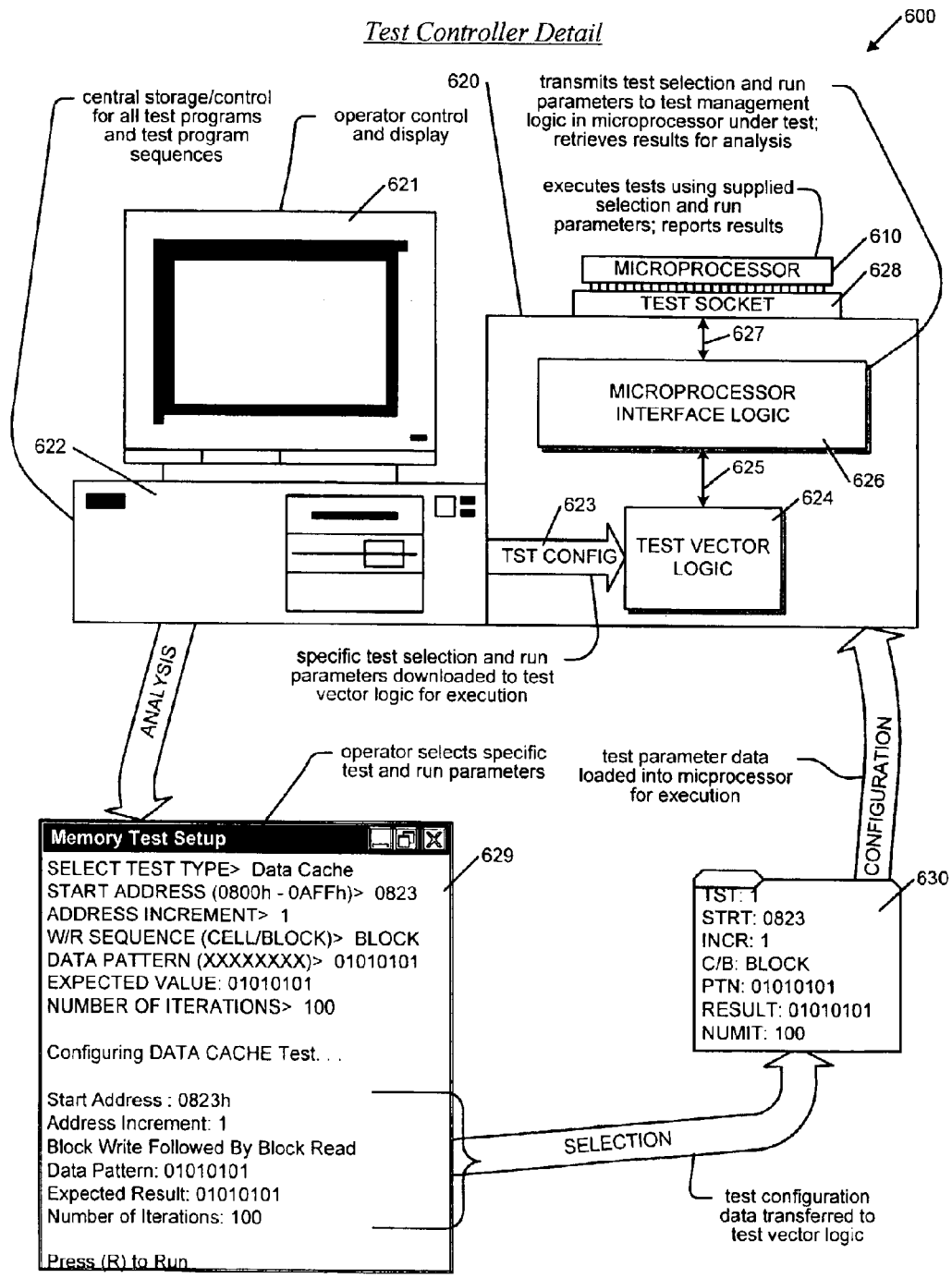
FIG. 6 is a diagram depicting details of a test controller according to the present invention.

Referring to FIG. 6, a diagram 600 is presented depicting details of a test controller 620 according to the present invention. The diagram 600 shows a microprocessor chip 610 according to the present invention installed into the test controller 620 for the purpose of testing memories (not shown) internal to the microprocessor 610. The test controller 620 has a test socket 628 to which all of the connection pins on the microprocessor 610 are connected. Each connection is routed via bus 627 to microprocessor interface logic 626. The microprocessor interface logic 626 interfaces to test vector logic 624 via bus 625. But, unlike the chip tester 220 of FIG. 2, the test controller 620 according to the present invention does not download test sequences to the test vector logic 224; it 620 downloads a test configuration program to transfer test parameters to the microprocessor 610. The test configuration program is transferred via bus 623 from a host computer 622. The host computer 622 is used to configure the test parameters for the microprocessor 610. An operator (not shown) configures the test parameters via an operator interface device 621, in one embodiment, a monitor and keyboard.

Operationally, during the design of a microprocessor 610 according to the present invention, characteristics and idiosyncrasies of the memories within the microprocessor 610 are noted by test engineers to produce a comprehensive set of data patterns and address access sequences to test the memories within the assembled microprocessor 610 in the test controller 620. The set of data patterns and address access sequences are incorporated into a series of test parameter configuration files which are stored in the host computer 622. Additionally, the address access sequences are generalized to the extent that they are reduced to a set of non-specific access sequences. The non-specific access sequences are designed into test management logic (not shown) in the microprocessor 610 so that any of the address access sequences can be executed by test execution logic (not shown) in the microprocessor 610 with any data pattern simply by applying test configuration parameters provided by the test controller 620. To provide further flexibility, the operator is also provided with the capability to dynamically generate specific test sequences. According to one embodiment, an interactive display 629 is shown for a sample case where the operator configures a specific test sequence via the operator interface device 621. Such a case would arise as a result of analysis of some previous result of a test, as alluded to above, where it is deemed necessary to perform an alternate sequence of memory accesses to further isolate a problem.

In one embodiment, the operator installs the microprocessor 610 into the test socket 628 and retrieves a particular test parameter configuration file 630 from a storage device (not shown) in the host computer 622. The test configuration program, including the particular test configuration file 630 is then transferred from the host computer 622 via bus 623 to the test vector logic 624.

The test vector logic 624 provides the interface between the host computer 622 and the microprocessor interface logic 626. As such, the test vector logic 624 provides temporary storage for the test parameter configuration program. The test vector logic 624 also executes the test parameter configuration program to cause specified pins on the microprocessor 610 to be set to prescribed states at prescribed times to transfer the test parameters to a configuration register (not shown) in the microprocessor 610 and to retrieve results from a result register (not shown) in the microprocessor 610. Because the test vector logic 624 is simply communicating test parameters and results to/from the microprocessor 610 rather than executing and monitoring a complex sequence of accesses, the complexity and cost of test vector logic 624 according to the present invention is significantly less than that required for the direct access method. The microprocessor interface logic 626 translates test vector signals provided over bus 625 so that they are compatible with the formats and levels required by the microprocessor 610. The translated signals are routed to the test socket 628 via bus 627. The test socket 628 provides a direct physical interface for each translated signal to a corresponding pin on the operational package of the microprocessor 210.

The test controller 620 according to the present invention affords the flexibility to configure test program parameters. And, because interactive capability is provided, test sequences can be modified. Thus, the course of testing for a microprocessor 610 according to the present invention is under the control of the operator. If a given test program yields questionable results, then the operator can perform the test again, or he can modify certain test parameters so that a failure mode can be further analyzed and its corresponding defect identified. In the extreme case, a case most often experienced during debug of a part prior to full rate production, if an unforeseen failure mode appears in the course of testing, the test controller 620 provides the flexibility to generate an entirely new test sequence for the express purpose of testing for the unforeseen failure mode.

Yet, there is a remarkable difference between testing memories in a microprocessor using a conventional techniques and testing memories in a microprocessor 610 in accordance with the present invention: the memories in the microprocessor 610 according to the present invention receive the combined benefits exhibited by each of the individual conventional test techniques, thus providing comprehensive test coverage at minimal resource cost. Memories are tested at full speed, and hence, test sequences to detect speed-related failure modes, are supported. The present invention provides the flexibility to configure a full set of tests to detect virtually any known or unknown defect. The present invention provides the comprehensive information required for repair of a memory array. In addition, the present invention only requires a small amount of tester resources.

Figure 7:
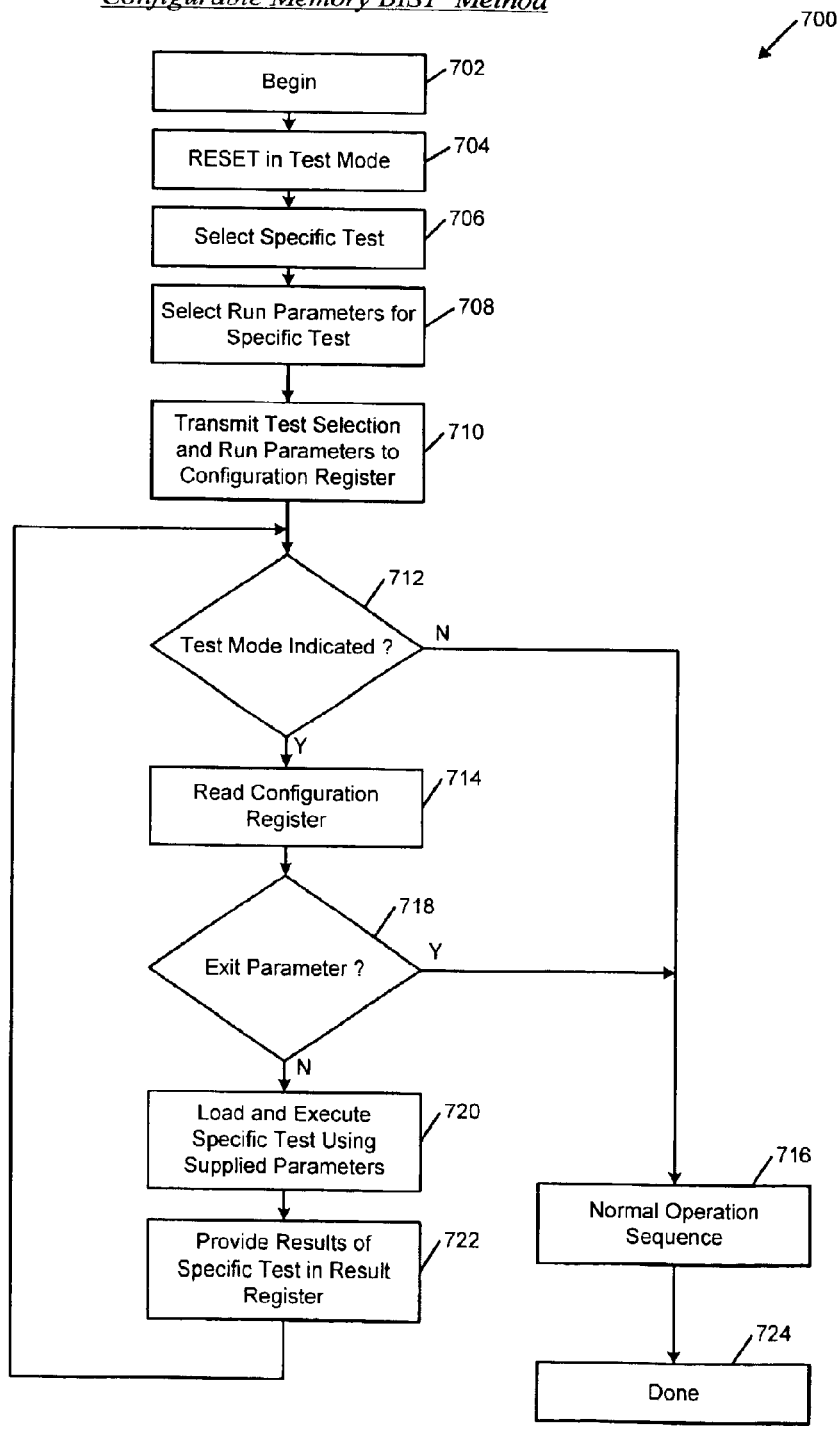
FIG. 7 is a flow chart illustrating a method for testing memory circuits in a microprocessor according to the present invention.

Now referring to FIG. 7, a flow chart 700 is presented illustrating a method for testing memory circuits in a microprocessor according to the present invention.

Flow begins at block 702, where a microprocessor according to the present invention is inserted into a test controller according to the present invention for the purpose of testing memories within the microprocessor. Flow then proceeds to block 704.

At block 704, the test controller generates a prescribed sequence of signal states to designated pins on the operational package of the microprocessor to place the microprocessor into a manufacturing test state. As a result, the microprocessor does not enter a normal operating mode, but transfers program control flow to a BIST area of its control ROM. Flow then proceeds to decision block 706.

At block 706, a specific test is selected, that is, a specific memory within the microprocessor is designated for testing. Flow then proceeds to block 708.

At block 708, run parameters for testing of the designated memory are selected. These parameters include start address, address increment, access mode, write data pattern, expected result, and number of repetitions for the test. In one embodiment, memory designation and run parameters can be stored in a configuration file. Flow then proceeds to block 710.

At block 710, the test selection and run parameters selected in blocks 706 and 708 are transmitted to a test configuration register in the microprocessor. Flow then proceeds to decision block 712.

At decision block 712, reset logic in the microprocessor evaluates signal states on the designated pins to determine if the microprocessor is to proceed to normal operation of to enter a BIST mode. If the signal states indicate normal operation, then flow proceeds to block 716. If the signal states indicate a manufacturing test mode, then flow proceeds to block 714.

At block 716, because the signal states on the pins indicate that the microprocessor is not in a test mode, program flow control is transferred to a normal operation area of control ROM in the microprocessor. Thus, the microprocessor enters a normal operational state. Flow then proceeds to block 724.

At block 714, program flow control is transferred to a manufacturing test area of control ROM, thus allowing the test controller to communicate with the microprocessor through the configuration register and a result register. Micro instructions in the control ROM direct the microprocessor to retrieve contents of the configuration register. Flow then proceeds to decision block 718.

At decision block 718, the contents of the configuration register are evaluated to determine if the test controller is directing the microprocessor to exit the manufacturing test mode. If so, then flow proceeds to block 716. If not, then flow proceeds to block 720.

At block 720, test parameters are retrieved from the test configuration register. These test parameters, sent by the test controller, are applied to a non-specific sequence of micro instructions so that a specific sequence of micro instructions is generated directing the microprocessor to test the specific memory designated in block 704 with the test parameters selected in block 706. Flow then proceeds to block 722.

At block 722, the specific sequence of micro instructions is executed by the microprocessor to test the specific memory. Test execution logic in the microprocessor executes the specific sequence of micro instructions to access designated memory addresses. As data is read, it is compared to the expected data and bit-by-bit results of the test are provided in a result register for retrieval by the test controller. Flow then proceeds to decision block 712.

At block 724, the method completes.

Although the present invention and its objects, features, and advantages have been described in detail, other embodiments are encompassed by the invention. For example, the present invention has been particularly described in terms of a sequence of test steps designed to test memories within a microprocessor. Although testing memories is a primary objective, the present invention also applies to testing other logic devices within the microprocessor by passing specific test configuration variables which are applied to a generic sequence of test instructions or logic to generate a specific test sequence.

In addition, the present invention has been specifically described in terms of a non-specific sequence of micro instructions wherein test parameters are applied to operands to form a specific sequence of micro instructions. For present day microprocessors, it is cost effective to generate test sequences by employing micro instructions rather than sequential logic. Yet, in the future, advances in the art may prevail such that sequential logic is more efficiently applied for the generation of test sequences. The present invention anticipates such improvements.

Furthermore, a number of intelligent integrated circuits utilize multiple memories within having signals that are not routed to external connection pins. Although principally designated for a microprocessor, the present invention comprehends testing of memories internal to any intelligent logic device where test parameters can be passed from a test controller to configure specific test sequences that are executed by BIST hardware within the device. Such devices include signal processors, embedded controllers, array processors, and industrial controllers.

Moreover, the present invention has been particularly characterized in such terms where a microprocessor is inserted into a test socket in a test controller for the purposes of performing a manufacturing test. However, the present invention also anticipates such alternative embodiments wherein external logic devices in an operational configuration, say a motherboard, may be used to initiate a manufacturing test mode and to provide certain parameters to executed a prescribed test within the microprocessor.

Those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. An apparatus in a microprocessor for testing memory within the microprocessor, the apparatus comprising:

test management logic, configured to accept test parameters from a source external to the microprocessor and to produce a specific test program, wherein said specific test program is produced from a non-specific test program by insertion of said test parameters in place of a plurality of non-specific test operands; and test execution logic, coupled to said test management logic, configured to execute said specific test program.

2. The apparatus as recited in claim 1, wherein said test parameters are provided by a test controller that is interfaced to the microprocessor.

3. The apparatus as recited in claim 2, wherein said test controller provides said test parameters to a JTAG register in the microprocessor.

4. An apparatus for testing memory in a microprocessor, the apparatus comprising:

a test controller, configured to provide test parameters to the microprocessor to configure a specific test program;

test management logic, within the microprocessor, coupled to said test controller, configured to accept said test parameters and to generate said specific test program, wherein said specific test program is generated from a non-specific test program by insertion of said test parameters in place of a plurality of non-specific test operands; and test execution logic, within the microprocessor, coupled to said test management logic, configured to execute said specific test program.

5. The apparatus as recited in claim 4, wherein said test controller comprises:

test parameter selection logic, configured to allow selection of said test parameters;

test vector logic, coupled to said test parameter selection logic, configured to store said test parameters; and microprocessor interface logic, coupled to said test vector logic, configured to accept said test parameters from said test vector logic, and to provide said test parameters to said test management logic.

6. The apparatus as recited in claim 5, wherein said test controller causes the microprocessor to enter a manufacturing test state.

7. The apparatus as recited in claim 6, wherein, during said manufacturing test state, said test management logic reads said test parameters and inserts said test parameters as operands in a sequence of micro instructions to generate said specific test program.

8. The apparatus as recited in claim 7, wherein said sequence of micro instructions is stored in a control ROM.

9. The apparatus as recited in claim 4, wherein said test execution logic reads from the memory as prescribed by said specific test program.

10. The apparatus as recited in claim 9, wherein said test execution logic writes to the memory as prescribed by said specific test program.

11. The apparatus as recited in claim 10, wherein said test management logic provides a intermediate test results to pins on the microprocessor.

12. The apparatus as recited in claim 11, wherein said test controller retrieves said intermediate test results.

13. The apparatus as recited in claim 4, wherein said test controller transmits said test parameters to a test configuration register in the microprocessor.

14. The apparatus as recited in claim 4, wherein said test execution logic comprises:

address generation logic, configured to generate memory addresses as prescribed by said specific test program;

data interface logic, coupled to said address generation logic, configured to read or write data entities to said memory addresses as prescribed by said specific test program; and read/write control logic, coupled to said address generation logic and said data interface logic, configured to provide read/write control signals to the memory at full speed as prescribed by said specific test program.

15. An apparatus for testing a microprocessor, comprising:

a test controller, for providing test parameters to the microprocessor that prescribe a specific test to be performed;

a test configuration register, located in the microprocessor and coupled to said test controller, for receiving said test parameters; and a first sequence of micro instructions stored in a control ROM, coupled to said test configuration register, for applying said test parameters to generate a second sequence of micro instructions that direct the microprocessor to execute said specific test, wherein said first sequence of micro instructions employs non-specific operands within, and wherein said test parameters are applied as operands in place of said non-specific operands to generate said second sequence of micro instructions.

16. The apparatus as recited in claim 15, wherein said test controller accesses intermediate test results via pins on the microprocessor.

17. The apparatus as recited in claim 16, wherein said test parameters prescribe said locations, data patterns associated with said locations, and number of iterations for said specific test.

18. A method for testing memory in a microprocessor at full speed, comprising:

provide parametric data to the microprocessor that prescribes a specific memory test;

applying the parametric data to a sequence of micro instructions within the microprocessor to form a specific sequence of micro instructions that direct the microprocessor to perform the specific memory test, wherein said applying comprises:

inserting specific operands in the sequence of micro instructions in place of non-specific operands to form the specific sequence of micro instructions; and executing the specific sequence of micro instructions by the microprocessor;

wherein execution of the specific sequence is performed at full speed.

19. The method as recited in claim 18, further comprising:

writing a intermediate test results to pins on the microprocessor.

* * * * *